(12) United States Patent
Mantani et al.

(10) Patent No.: US 10,542,649 B2
(45) Date of Patent: Jan. 21, 2020

(54) COMPONENT MOUNTING RELATED APPARATUS AND COMPONENT MOUNTING RELATED SYSTEM

(71) Applicant: Panasonic Intellectual Property Management Co., Ltd., Osaka (JP)

(72) Inventors: Masayuki Mantani, Yamanashi (JP); Minoru Murakami, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 538 days.

(21) Appl. No.: 14/798,616

(22) Filed: Jul. 14, 2015

(65) Prior Publication Data
US 2016/0021804 A1    Jan. 21, 2016

(30) Foreign Application Priority Data

Jul. 15, 2014    (JP) .................................. 2014-144697
Sep. 12, 2014    (JP) .................................. 2014-185902

(51) Int. Cl.
*H05K 13/04*    (2006.01)

(52) U.S. Cl.
CPC ................................ *H05K 13/0495* (2013.01)

(58) Field of Classification Search
CPC ................... H05K 13/0404–0413; H02J 11/00
See application file for complete search history.

(56) References Cited

U.S. PATENT DOCUMENTS 5,490,493 A * 2/1996 Salansky ................ A63B 69/40
124/1
6,185,010 B1 * 2/2001 Watanabe .......... H04N 1/00278
358/442

(Continued)

FOREIGN PATENT DOCUMENTS

JP    2009-070867 A    4/2009
JP    2010-263068 A    11/2010

(Continued)

OTHER PUBLICATIONS

English Translation of Chinese Search Report dated Nov. 2, 2018 for the related Chinese Patent Application No. 201510416745.0.

*Primary Examiner* — Livius R. Cazan
(74) *Attorney, Agent, or Firm* — Pearne & Gordon LLP

(57) ABSTRACT

A component mounting related system is provided with a first component mounting related apparatus, a second component mounting related apparatus, an electric power source provided in the first component mounting related apparatus, a first power transmission line provided in the first component mounting related apparatus, a power transmission connector, and a second power transmission line. The electric power source supplies an electric power for actuating the first component mounting related apparatus. The first power transmission line transmits the electric power in the first component mounting related apparatus. The power transmission connector transmits the electric power transmitted by the first power transmission line to the second component mounting related apparatus. The second power transmission line transmit, in the second component mounting related apparatus, the electric power supplied from the first component mounting related apparatus through the power transmission connector.

4 Claims, 13 Drawing Sheets

(56) References Cited

U.S. PATENT DOCUMENTS

| | | | | |
|---|---|---|---|---|
| 6,398,588 B1 * | 6/2002 | Bickford | ..........  | H01R 13/65802 333/12 |
| 7,125,184 B2 * | 10/2006 | Cheng | ..................... | B41J 29/02 400/693 |
| 2010/0242755 A1 | 9/2010 | Nagao | | |
| 2015/0223374 A1 * | 8/2015 | Nozawa | ............. | H05K 13/0417 29/739 |
| 2015/0345930 A1 * | 12/2015 | Ikeda | ................... | B23K 3/0638 356/630 |

FOREIGN PATENT DOCUMENTS

| | | | | |
|---|---|---|---|---|
| JP | 2010263068 A | * | 11/2010 | |
| WO | WO 2014045664 A1 | * | 3/2014 | ......... H05K 13/0417 |
| WO | WO 2014103262 A1 | * | 7/2014 | ......... H05K 13/0465 |

* cited by examiner

COMPONENT MOUNTING RELATED APPARATUS AND COMPONENT MOUNTING RELATED SYSTEM

CROSS-REFERENCES TO RELATED APPLICATION(S)

This application is based on and claims priorities from Japanese Patent Applications No. 2014-144697 filed on Jul. 15, 2014 and No. 2014-185902 filed on Sep. 12, 2014, the entire contents of which are incorporated herein by reference.

BACKGROUND

1. Field of the Invention

One or more embodiments of the present invention relate to a component mounting related apparatus and a component mounting related system for executing a component mounting related operation for mounting a component on a substrate.

2. Description of Related Art

A component mounting line that executes operations for manufacturing component mounted substrates by mounting components on substrates includes a plurality of kinds of component mounting relates apparatuses such as component mounting apparatuses and screen printing apparatuses.

A component mounting apparatus includes a substrate conveying line for conveying and positioning substrates, a component supplying portion for supplying components, a component attaching mechanism that suctions the components supplied by the component supplying portion by a suction nozzle and mounts the components on the substrates positioned by the substrate conveying line, and so on. The component mounting apparatus includes an electric power source for supplying an actuating electric power, and the electric power supplied by the electric power source is transmitted through a power transmission line in the component mounting apparatus.

Patent Document 1 discloses a component mounting system in which two component mounting apparatuses are arranged back-to-back with each other. Since the component mounting system includes two independent substrate conveying lines (lanes), it is possible to perform mounting operations for two substrates simultaneously.

A screen printing apparatus includes a mechanism for making a substrate in contact with a mask plate and a screen printing mechanism having a squeegee slidably moving on the mask plate on which a paste is supplied and so on. The screen printing apparatus includes an electric power source for supplying an actuating electric power and the electric power supplied by the electric power source is transmitted through a power transmission line in the screen printing apparatus.

Patent Document 2 discloses a screen printing system in which two screen printing apparatuses are arranged back-to-back with each other. Since the screen printing system includes two independent substrate conveying lines (lanes), it is possible to perform screen printing operations for two substrates simultaneously.

Patent Document 1: JP-A-2010-263068
Patent Document 2: JP-A-2009-070867

SUMMARY

The systems of Patent Document 1 and Patent Document 2 require two component mounting related apparatuses respectively including dedicated electric power sources in order to provide two substrate conveying lanes. Therefore, costs for the system are increased.

One or more embodiments of the present invention relate to a component mounting related apparatus and component mounting related system which can provide a system with two lanes in a reasonable cost.

According to one or more embodiments, in a component mounting related apparatus that executes a component mounting related operation for mounting a component on a substrate, the apparatus is provided with an electric power source configured to supply an electric power for actuating the component mounting related apparatus, a first power transmission line configured to transmit the electric power supplied by the electric power source in the component mounting related apparatus, and a power transmission connector configured to output the electric power transmitted by the first power transmission line to another component mounting related apparatus which is placed back-to-back with the component mounting related apparatus.

According to one more embodiments, in a component mounting related system configured to execute a component mounting related operation and including a first component mounting related apparatus and a second component mounting related apparatus placed back-to-back with respect to the first component mounting related apparatus, the system is provided with: an electric power source provided in the first component mounting related apparatus and configured to supply an electric power for actuating the first component mounting related apparatus; a first power transmission line provided in the first component mounting related apparatus and configured to transmit the electric power supplied by the electric power source in the first component mounting related apparatus; a power transmission connector configured to transmit the electric power transmitted by the first power transmission line to the second component mounting related apparatus; and a second power transmission line provided in the second component mounting related apparatus and configured to transmit the electric power supplied from the first component mounting related apparatus through the power transmission connector in the second component mounting related apparatus In accordance with the apparatus and system of one or more embodiments, it is possible to provide a component mounting related system with two lanes in reasonable costs.

DETAILED DESCRIPTION

Exemplary embodiments will be described with reference to drawings. Component mounting lines of the exemplary embodiments are configured to manufacture component mounted substrates by mounting components on the substrates, and provided with a plurality kinds of components mounting related apparatus such as screen printing apparatus, components mounting apparatus, and so on. In the exemplary embodiments, systems configured by connecting similar kinds of component mounting related apparatuses are referred as component mounting related systems. In this description, as examples of the components mounting related apparatus and the components mounting related systems, a component mounting apparatus and a component mounting system are described in a first exemplary embodiment, and a screen printing apparatus and a screen printing systems are described in the second exemplary embodiment. However, the present invention should not be limited to the apparatuses and systems of the exemplary embodiments, provided that apparatuses and systems are devises for performing operations relating to component mounting.

First Exemplary Embodiment

Figure 1:
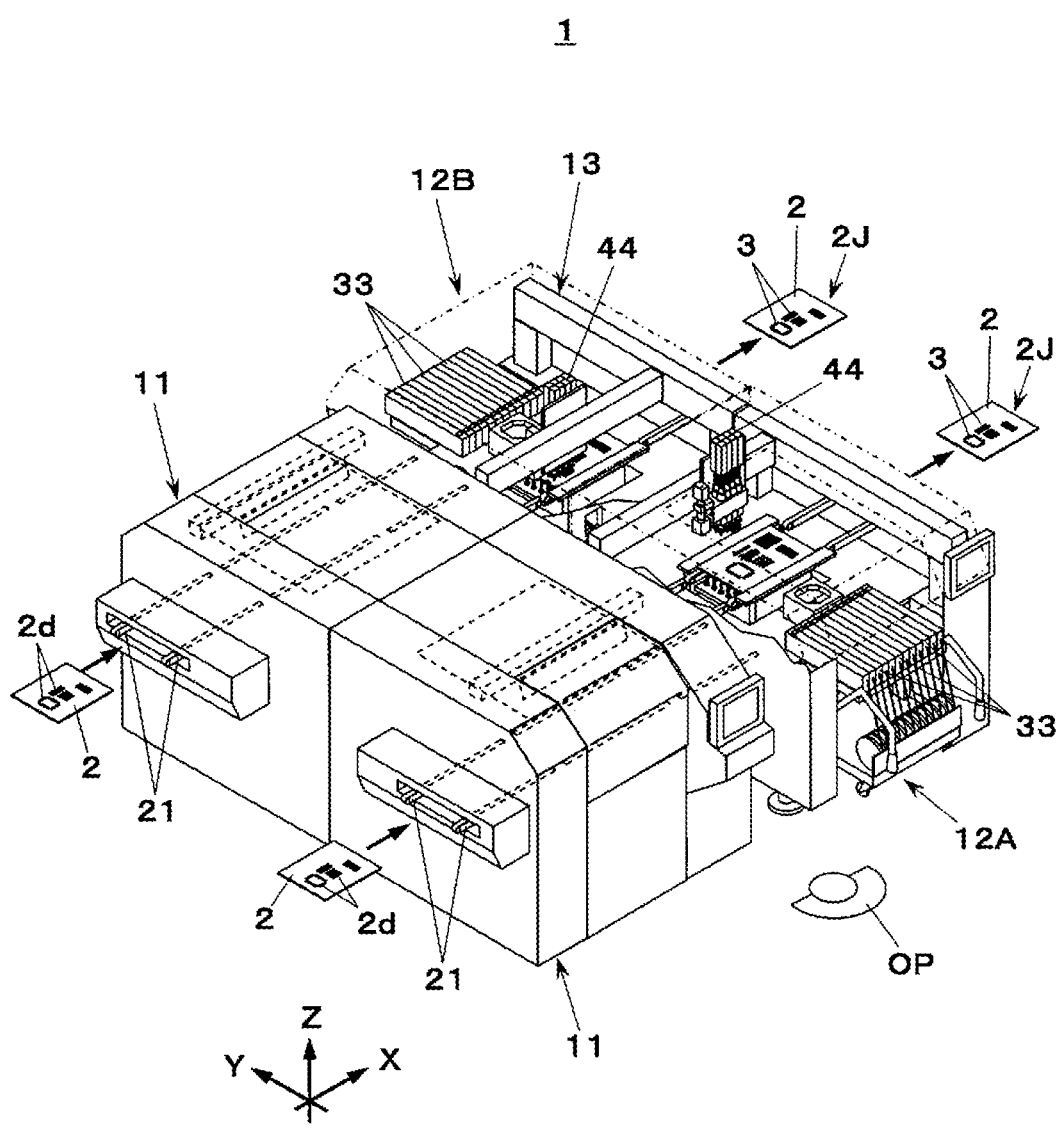
FIG. 1 is a perspective view of a component mounting line including a component mounting system of a first exemplary embodiment.
Figure 2:
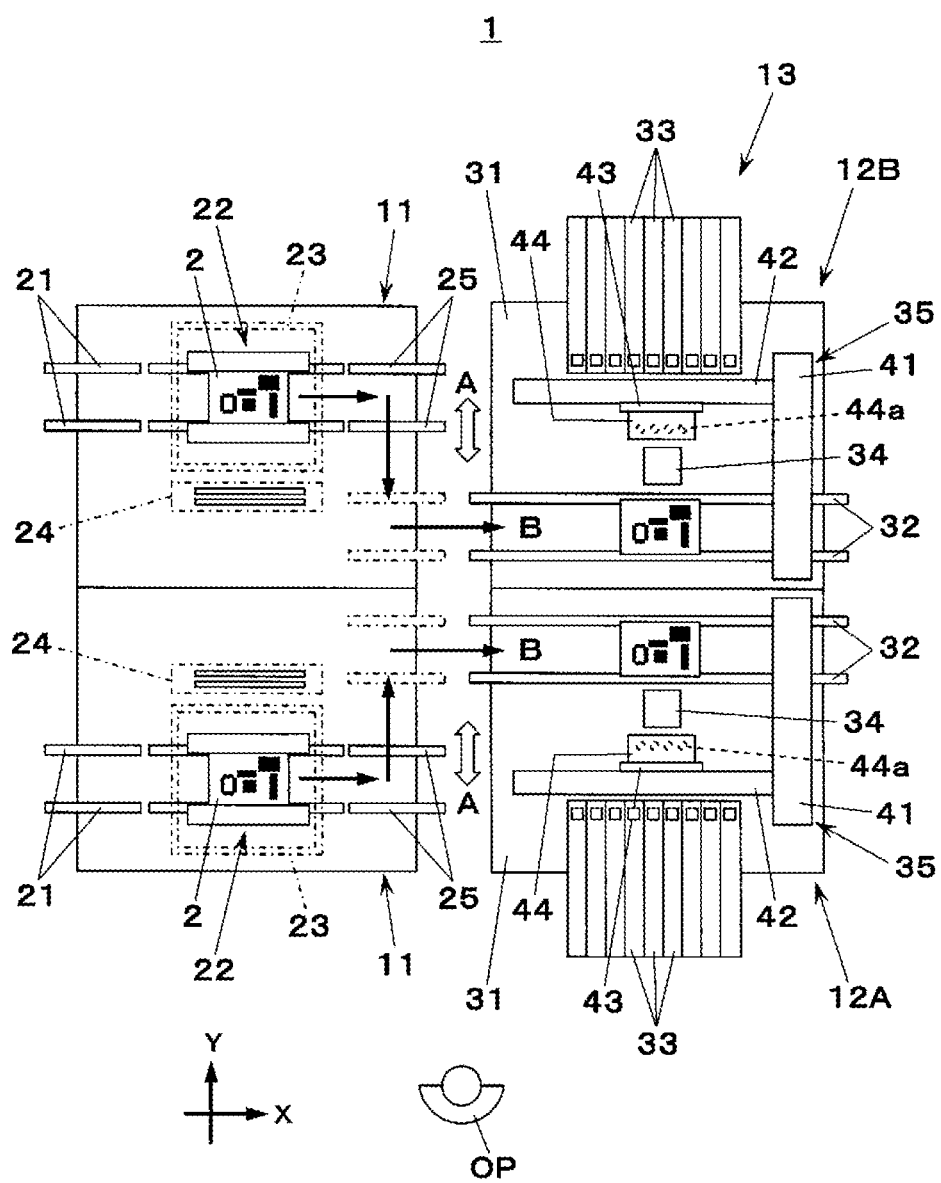
FIG. 2 is a plane view of the component mounting line including the component mounting system of the first exemplary embodiment.

FIG. 1 and FIG. 2 show a component mounting line 1 of a first exemplary embodiment. In the component mounting line 1, operations for manufacturing component mounted substrates 2J by mounting components 3 on substrates 2 are performed in two lanes. The component mounting line 1 is provided with a component mounting system 13 configured by two screen printing apparatuses 11 arranged in parallel to flows of the substrates 2 and two component mounting apparatus (i.e. a primary mounting apparatus 12A and a secondary mounting apparatus 12B) arranged in a downer stream side of the two screen printing apparatus. In the first exemplary embodiment, a right-left direction seen by an operator OP is a direction that the substrates 2 are fed and the direction is set as an X direction. The substrates 2 are fed from left to right seen by the operator OP. A front-rear direction seen by the operator OP is set as a Y direction. A up-down direction seen by the operator is set as Z direction.

Figure 3:
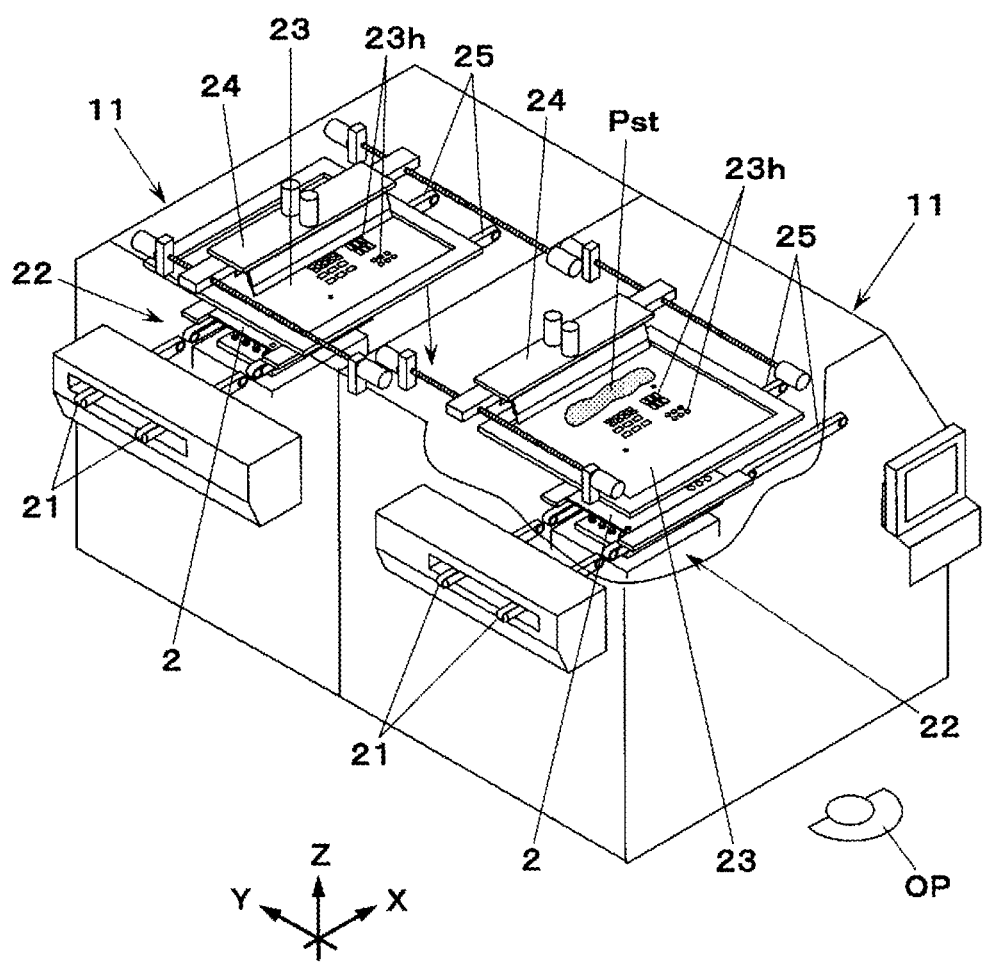
FIG. 3 is a perspective view of a screen printing apparatus included in the component mounting system of the first exemplary embodiment.

As shown in FIG. 2 and FIG. 3, the screen printing apparatuses 11 are arranged back-to-back with each other. In each of the screen printing apparatus 11, a substrate 2 is conveyed and positioned by a feed-in conveyer 21, and then the substrate 2 is transferred to a substrate feeding mechanism 22. The substrate feeding mechanism 22 feeds the substrate 2 so that an upper surface of the substrate 2 contacts to a lower surface of a mask plate 23 formed with pattern holes 23h and a squeegee 24 slidably moves on the mask plate 23. Accordingly, a paste Pst which is supplied on the mask plate in advance is scraped, and the paste Pst is printed on terminals 2d (see FIG. 1) of the substrate 2 through the pattern holes 23h. The substrate 2 on which the paste Pst is printed is fed out by the feed-out conveyer 25 to the lower stream side. The feed-out conveyer 25 is movable in the Y direction (arrow A in FIG. 2), and the feed-out conveyer 25 transfers the substrate 2 to the primary mounting apparatus 12A or the secondary mounting apparatus 12B (arrow B in FIG. 2).

Figure 4:
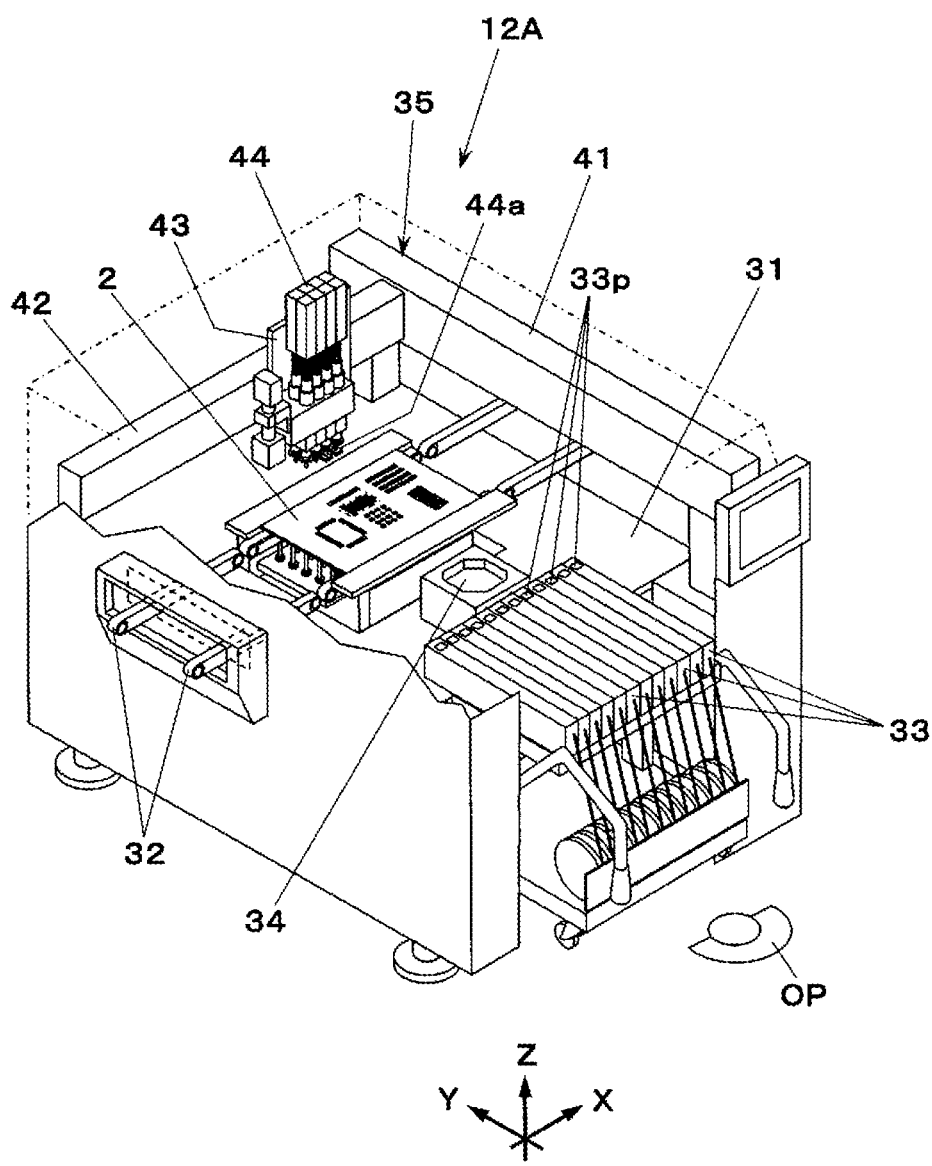
FIG. 4 is a perspective view of a primary mounting apparatus configuring the component mounting system of the first exemplary embodiment.
Figure 5:
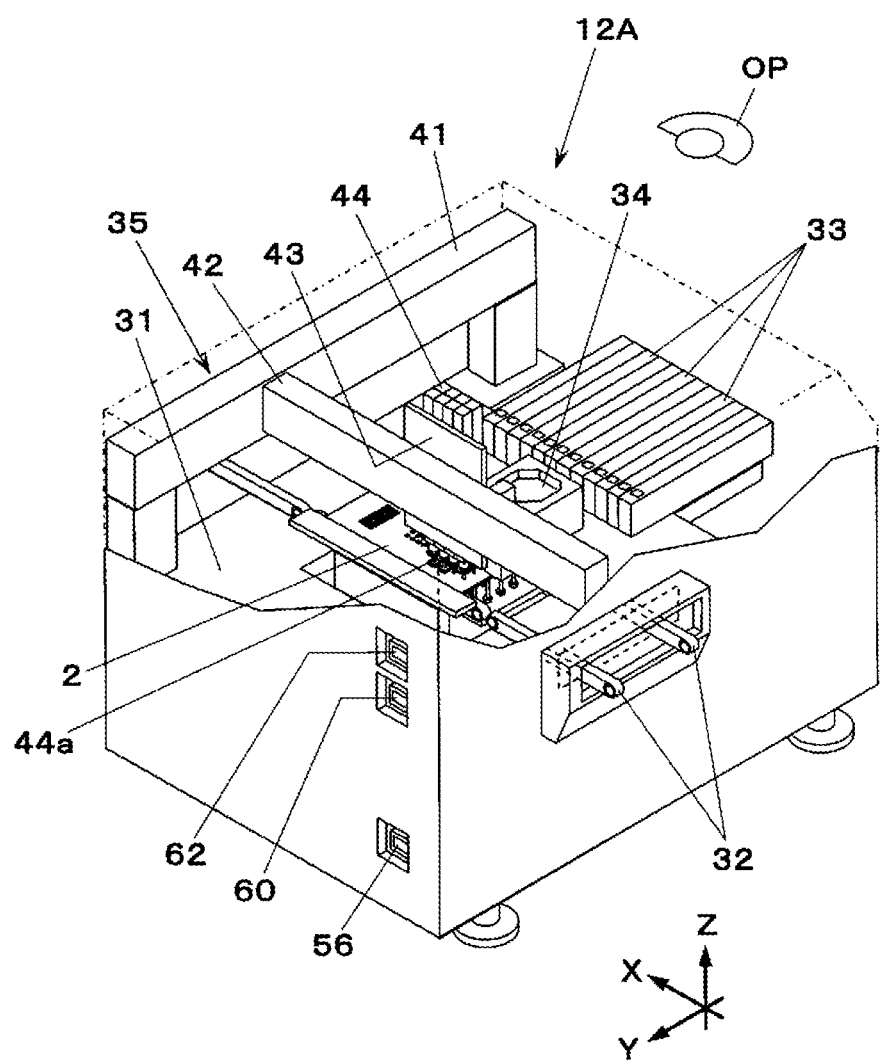
FIG. 5 is a perspective view of the primary mounting apparatus configuring the component mounting system of the first exemplary embodiment.
Figure 6:
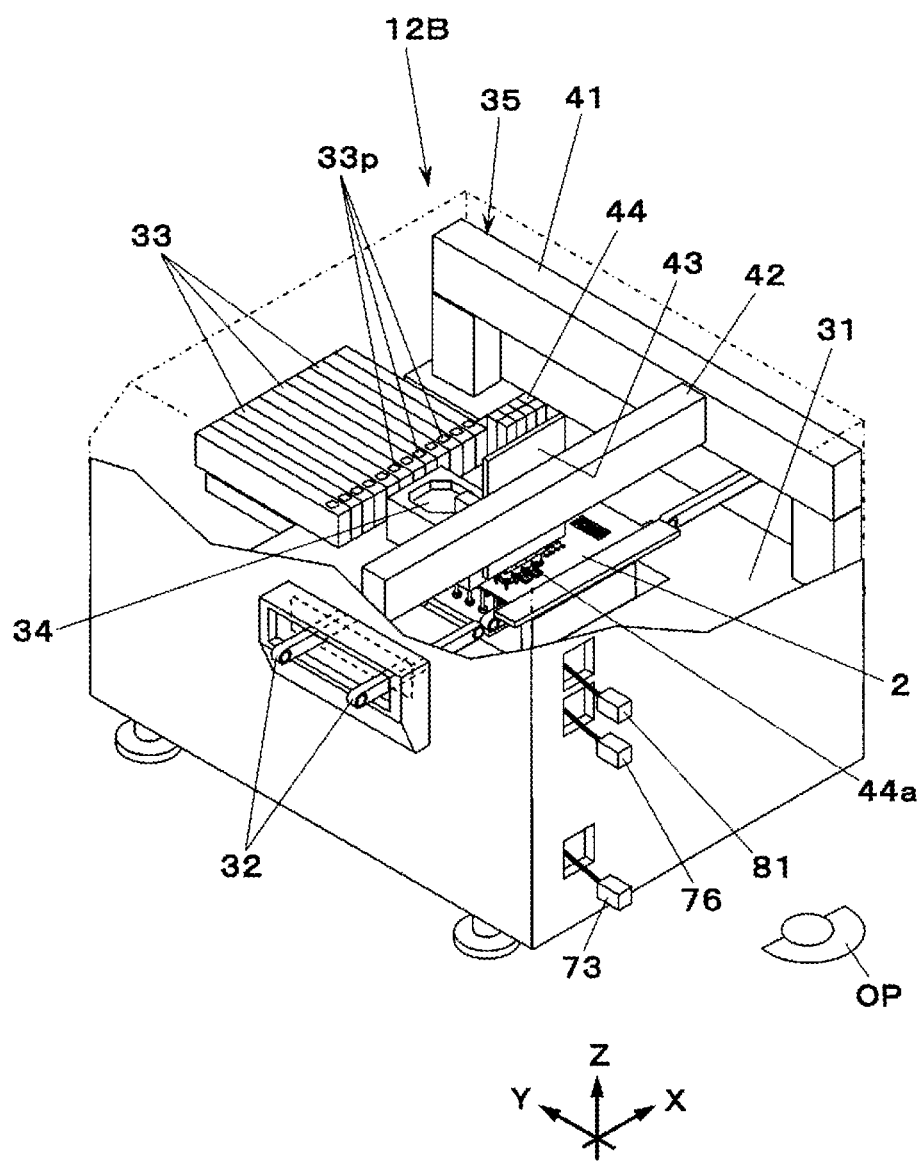
FIG. 6 is a perspective view of a secondary mounting apparatus configuring the component mounting system of the first exemplary embodiment.

In each of the primary mounting apparatus 12A and the secondary mounting apparatus 12B, components 3 are mounted on the substrate 2 which is fed from the screen printing apparatus 11 and on which the pates Pst is printed. FIG. 4 and FIG. 5 show the primary mounting apparatus 12A, and FIG. 6 shows the secondary mounting apparatus 12B. As shown in FIG. 2 and FIG. 4 to FIG. 6, in each of the primary mounting apparatus 12A and the secondary mounting apparatus 12B, a substrate conveying line 32, parts feeders 33, a component camera 24 and a component attaching mechanism 35 are provided on a base table 31. The substrate conveying line 32 conveys the substrate 2 in the X direction. The parts feeders 33 supply components 3 to parts supply openings 33p. The components camera 34 directs its imaging range in upper side and disposed between the parts feeders 33 and the substrate conveying line 32. The component attaching mechanism 35 includes a Y-axis table 41 extending in the Y direction on the base table 31, an X-axis table 42 which is movable in the Y direction along the Y-axis table 41, a plate member 43 which is movable in the X direction along the X-axis table 42, and mounting heads 44 attached to the plate member 43. The mounting heads 44 are provided with components suction nozzles 44a. The mounting heads 44 is movable in a horizontal plane by a combination of a Y direction movement of the X-axis table 42 with respect to the Y-axis table 41 and an X direction movement of the plate member 43 with respect to the X-axis table 42.

When the substrate 2 on which paste is printed in fed from the screen printing apparatus 11, the substrate conveying line 32 receives and position the substrate 2. The parts feeders 33 supply components 3 to the parts supply openings 33p. In the mounting heads 44, the components suction nozzles 44a suction the components 3 fed to the parts supply openings 33p. Then, the mounting heads 44 moves so that the suctioned component 3 passes above the component camera 34, and that the component camera takes an image of the component 3. When the component camera 34 takes the image of the component 3 and recognizes the component 3, the mounting heads 44 moves above the substrate 2 and mounts the component 3 on the terminals 2d of the substrate 2 based on recognized information of the component 3 by the component camera 34. When the mounting of the components 3 which should be mounted on the substrate 2 is completed, the substrate conveying line 32 feeds out the substrate 2 in the lower stream side.

An electric power supply system of the component mounting apparatus (the primary mounting apparatus 12A and the secondary mounting apparatus 12B) and the component mounting system 13 is described.

As shown in FIGS. 7A, 7B, 8A and 8B, the primary mounting apparatus 12A is provided with a first floor space 51 and a second floor space 52. In an inside of the first floor space 51 of the primary mounting apparatus 12A, a power source 53, a primary side AC power transmission line 54, a primary side AC power terminal block 55, a primary side AC power connector 56 and a control unit 57 are provided.

The power source 53 transforms a voltage (e.g. 480V) of an outer electric power taken from an outside to a predetermined voltage (e.g. 200V) to generate an AC power. The power source 53 further transforms and commutates the generated AC power to generate a DC power of a predetermined voltage (e.g. 24V). The generated AC power is supplied to actuating devices respectively provided in the primary mounting apparatus 12A and the secondary mounting apparatus 12B as their actuating power source. The generated DC power is supplied to control devices such as control unit 57 as their actuating power source.

Figure 7A:
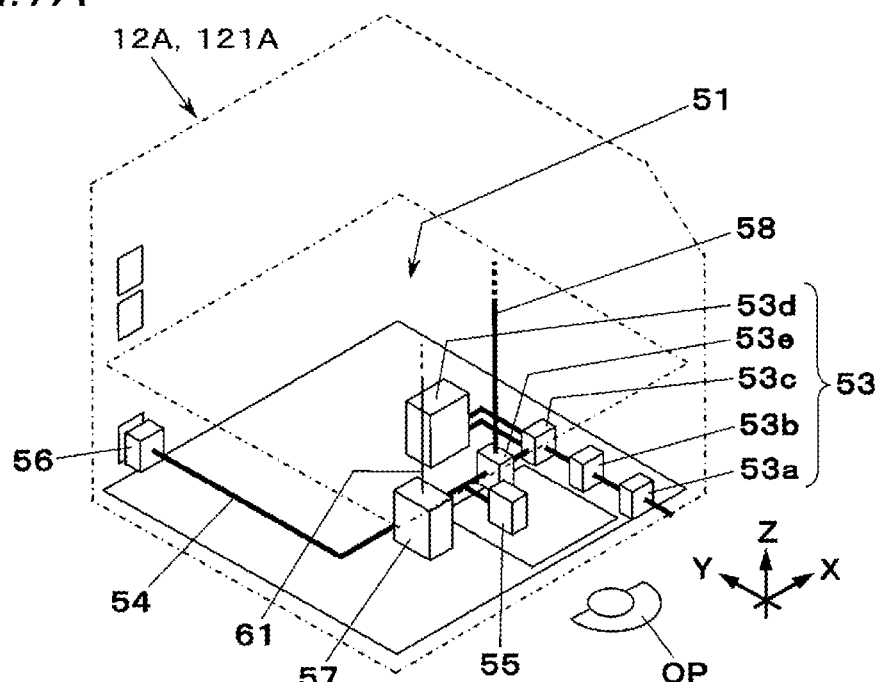
FIG. 7A is a perspective view of the primary mounting apparatus configuring the component mounting system of the first exemplary embodiment and a second exemplary embodiment.

As shown in FIG. 7A, the power source 53 specifically includes a main switch 53a, a breaker 53b, a noise filter 53c, a transformer 53d (voltage inverter), a DC power source (AC/DC converter) 53e. The main switch 53a is operated by the operator OP for turning on and off a power supply from the outside. The breaker 53b automatically turns off the power supply from the outside depending on necessity. The noise filter 53c cuts noises on the outer electric power. The transformer 53d transforms the outer electric power to generate the AC power. The DC power source 53e generates the DC power by transforming and commutating the AC power transformed by the transformer 53d.

The primary side AC power transmission line 54 is an electric cable for transmitting the AC power supplied by the power source 53 in the first floor space 51 of the primary mounting apparatus 12A. The primary side AC power terminal block 55 is connected to the primary side AC power transmission line 54, and is connected to the various actuating devices disposed in the first floor space 51 in the primary mounting apparatus 12A. The primary side AC power connector 56 is provided in order to output the AC power transmitted by the primary side AC power transmission line 54 to a side of the secondary mounting apparatus 12B. The primary side AC power connector 56 is disposed to face an opening in a back side of the primary mounting apparatus 12A (see FIG. 5). The control unit 57 outputs signals (first control signals) for controlling control devices provided in the primary mounting apparatus 12A and signals (second control signals) for controlling control devices provided in the secondary mounting apparatus 12B.

Figure 7B:
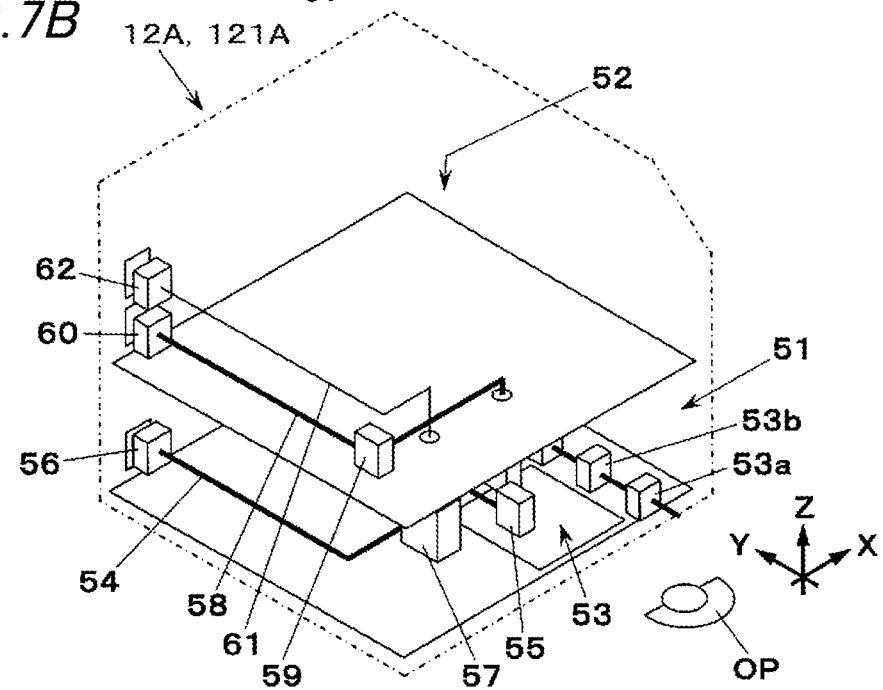
FIG. 7B is a perspective view of the primary mounting apparatus configuring the component mounting system of the first exemplary embodiment and a second exemplary embodiment.

As shown in FIG. 7B, in the second floor space 52 of the primary mounting apparatus 12A, a primary side DC power transmission line 58, a primary side DC power terminal block 59 and a primary side DC power connector 60 are provided. The primary side DC power transmission line 58 is an electric cable for transmitting the DC power generated by the DC power source 53e in the second floor space 52 of the primary mounting apparatus 12A. The primary side DC power terminal block 59 is connected to the primary side DC power transmission line 58 and connected to the various control devices disposed in the second floor space 52 of the primary mounting apparatus 12A. The primary side DC power connector 60 is provided in order to output the DC power transmitted by the primary side DC power transmission line 58 to a side of the secondary mounting apparatus 12B. The primary side DC power connector 60 is disposed to face an opening in the back side of the primary mounting apparatus 12A (see FIG. 5).

As shown in FIG. 7B, in the second floor space 52 of the primary mounting apparatus 12A, a primary side signal transmission line 61 and a primary side signal transmission connector 62 connected to the primary side signal transmission line 61 are provided. The primary side signal transmission line 61 is a signal cable for transmitting the first control signals and the second control signals outputted by the control unit 57 in the second floor space 52 of the primary mounting apparatus 12A. The primary side signal transmission connector 62 is provided in order to output the control signals transmitted by the primary side signal transmission line 61 to a side of the secondary mounting apparatus 12B. The primary side signal transmission connector 62 is disposed to face an opening in the back side of the primary mounting apparatus 12A (see FIG. 5).

Figure 8A:
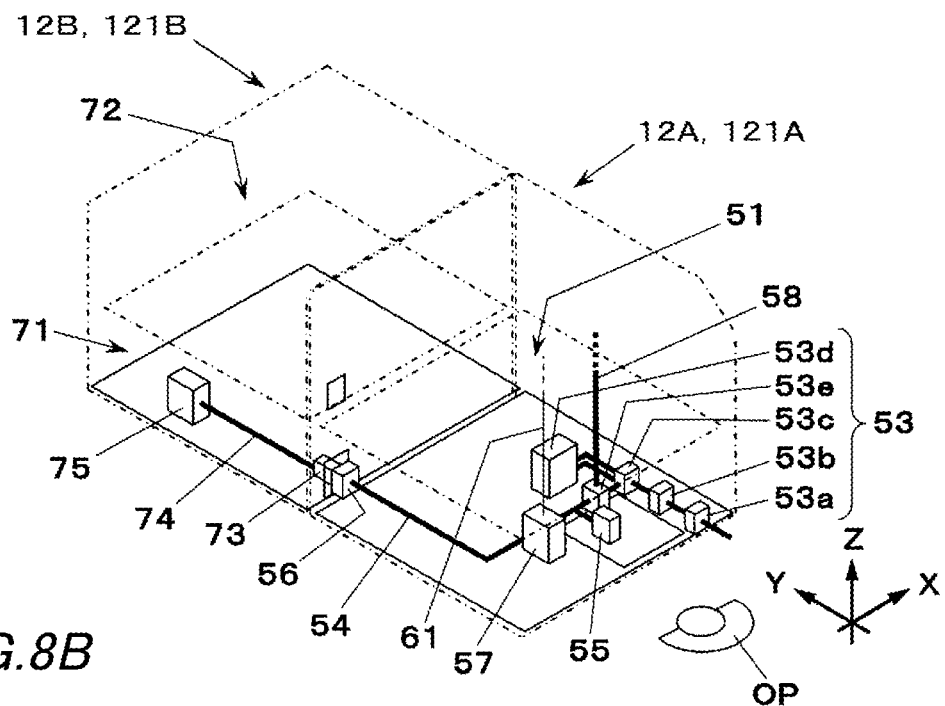
FIG. 8A is a perspective view of the component mounting system of the first exemplary embodiment and the second exemplary embodiment.
Figure 8B:
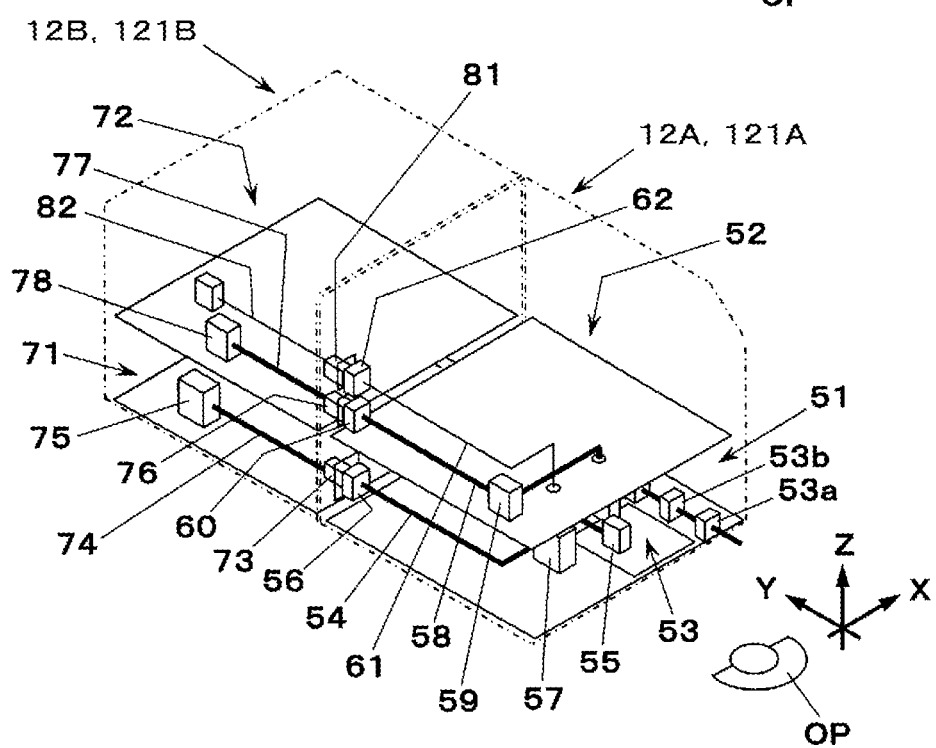
FIG. 8B is a perspective view of the component mounting system of the first exemplary embodiment and the second exemplary embodiment.

As shown in FIGS. 8A and 8B, the secondary mounting apparatus 12B has a first floor space 71 and a second floor space 72 therein. In the first floor space 71, a secondary side AC power connector 73, a secondary side AC power transmission line 74 connected to the secondary side AC power connector 73, and a secondary side AC power terminal block 53 connected to the secondary side AC power transmission line 74.

The secondary AC power connector 73 extends to an outside from an opening in a back side of the secondary mounting apparatus 12B (see FIG. 6) and connected to the primary side AC power connector 56. The secondary side AC power transmission line 74 is an electric cable for transmitting the AC power that the power source 53 supplies through the primary side AC power transmission line 54 in the first floor space 71 of the secondary mounting apparatus 12B when the secondary side AC power connector 73 is connected to the primary side AC power connector 56. The secondary side AC power terminal block 75 is connected to the secondary side power transmission line 74, and various actuating devices disposed in the first floor space 71 of the secondary mounting apparatus 12B are connected to the secondary side AC power terminal block 75.

As shown in FIGS. 8A and 8B, in the second floor space 72 of the secondary mounting apparatus 12B, a secondary side DC power connector 76, a secondary side DC power transmission line 77 and a secondary side DC power terminal block 78 are provided. The secondary side DC power connector 76 extends to an outside from an opening in the back side of the secondary mounting apparatus 12B (see FIG. 6), and the secondary side DC power connector 76 is connected to the primary side DC power connector 60. The secondary side DC power transmission line 77 is an electric cable for transmitting the DC power that the power source 53 supplies through the primary side DC power transmission line 58 in the second floor space 72 of the secondary mounting apparatus 12B, when the secondary side DC connector 76 is connected to the primary side DC power connector 60. The secondary side DC power terminal block 78 is connected to the secondary side DC power transmission line 77, and various control devices disposed in the second floor space 72 of the secondary mounting apparatus 12B are connected to the secondary side power terminal block 78.

As shown in FIGS. 8A and 8B, in the second floor space 72 of the secondary mounting apparatus 12B, a secondary side signal transmission connector 81 and a secondary side signal transmission line 82 which is connected to the secondary side signal transmission connector 81 are provided. The secondary side signal transmission connector 81 extends to an outside from an opening in the back side of the secondary mounting apparatus (see FIG. 6), and the secondary side signal transmission connector 81 is connected to the primary side signal transmission connector 62. The secondary side signal transmission connector 82 is a signal cable that transmits the second signals transmitted from the primary mounting apparatus 12A in the second floor space 72 of the secondary mounting apparatus 12B when the secondary side signal transmission connector 18 is connected to the primary side signal transmission connector 62.

In the present exemplary embodiment, in order to prevent noises which are generated in the transmission paths of the AC power and transmitted in the transmission paths from badly effecting to reliabilities of signals, a wiring of the transmission paths of the AC power and a wiring of the transmission path of the DC power are arranged in the floors different from each other. If it is possible to prevent the noises of the transmission paths of the AC power from badly effecting to the signals by another methods for example by sufficiently shielding the transmission paths of the AC power, it would be unnecessary to wire the transmission paths of the AC power and the transmission paths of the signals in the different floors.

According to the component mounting system 13 of the present exemplary embodiment, the primary mounting apparatus 12A is provided with the power source 53, a first power transmission line (the primary side AC power transmission line 54 and the primary side DC power transmission line 68) for transmitting the power (AC power and DC power) supplied by the power source 53 in the primary side mounting apparatus 12A, a power transmission connector (the primary side AC power connector 56 and the primary side DC power connector 60) for outputting the power transmitted by the first power transmission line to the secondary mounting apparatus 12B arranged back-to-back with the primary mounting apparatus 12A. The secondary mounting apparatus 12B is provided with a second power transmission line (the secondary side AC power transmission line 74 and the secondary side DC power transmission line 77) for transmitting, in the secondary mounting apparatus 12B, the power supplied from the primary mounting apparatus 12A through a power transmission connector (the secondary AC power connector 73 and the secondary DC power connector 76) which is connected to the power transmission connector of the primary mounting apparatus 12A.

That is, in the component mounting system 13 of the present exemplary embodiment, the power source 53 for supplying the electric power (the AC power and the DC power) is provided only in the primary mounting apparatus 12A, and a supply of power for actuation to the actuation devices provided in the primary mounting apparatus 12A is carried out from the power source 53 through the primary side AC power transmission line 54 and the primary side DC power transmission line 58 (the first power transmission line). A supply of power for actuation to the actuation devices provided in the secondary mounting apparatus 12B is carried out through the power transmission connectors (the primary side power transmission connector 56 and the secondary side power transmission connector 60) connected to the first power transmission line.

In the component mounting system 13 of the present exemplary embodiment, the primary mounting apparatus 12A is provided with the control unit 57, a first signal transmission line (the primary side signal transmission line 61) for transmitting the first control signals and the second control signals outputted by the control unit 57 in the primary mounting apparatus 12A, a signal transmission connector (the primary side signal transmission connector 62) for outputting the second control signal transmitted by the first signal transmission line to the secondary mounting apparatus 12B which is arranged back-to-back with the primary mounting apparatus 12A. The secondary mounting apparatus 12B is provided with a second signal transmission line (the secondary side signal transmission line 82) for transmitting the second control signals transmitted from the primary mounting apparatus 12A through a signal transmission connector (the secondary signal transmission connector 81) connected to the signal transmission connector (the primary signal transmission connector 62) in the secondary mounting apparatus 12B.

That is, in the component mounting system 13 of the present exemplary embodiment, the control unit 57 that outputs control signals (the first control signals and the second control signals) for controlling the control devices is provided only in the primary mounting apparatus 12A. The first control signals are transmitted from the control unit 57 through the primary side signal transmission line 61 (first signal transmission line). The second control signals are transmitted to the secondary mounting apparatus 12B through the primary side signal transmission connector 62 (signal transmission connector) connected to the primary side signal transmission line 61.

As described in the above, according to the component mounting system 13 (the component mounting line 1), the power source 53 for supplying the electric power is provided only in the primary mounting apparatus 12A (first component mounting apparatus). The power for actuation is supplied to the secondary mounting apparatus 12B (second component mounting apparatus) arranged back-to-back with the primary mounting apparatus 12A through the power transmission connector (the primary side power transmission connector 56 and the secondary side power transmission connector 60). Therefore, if the secondary mounting apparatus 12B includes the secondary side AC power transmission line 74 and the secondary side DC power transmission line 77 (second power transmission line) for transmitting the power supplied from the primary mounting apparatus 12A through the power transmission connector, it is unnecessary that the secondary mounting apparatus 12B includes a power source. Accordingly, the component mounting system 13 with two lanes can be provided in a low cost.

Second Exemplary Embodiment

Figure 9:
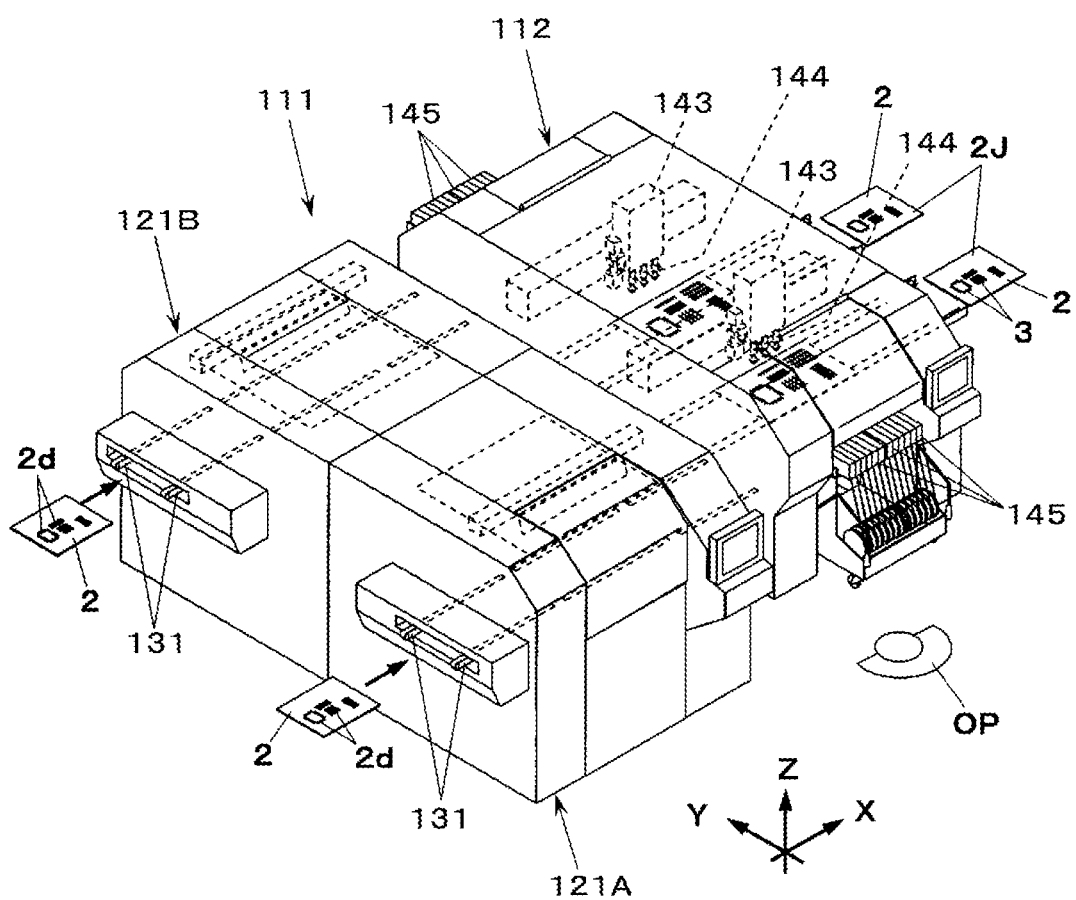
FIG. 9 is a perspective view of a component mounting line including a screen printing system of the second exemplary embodiment.
Figure 10:
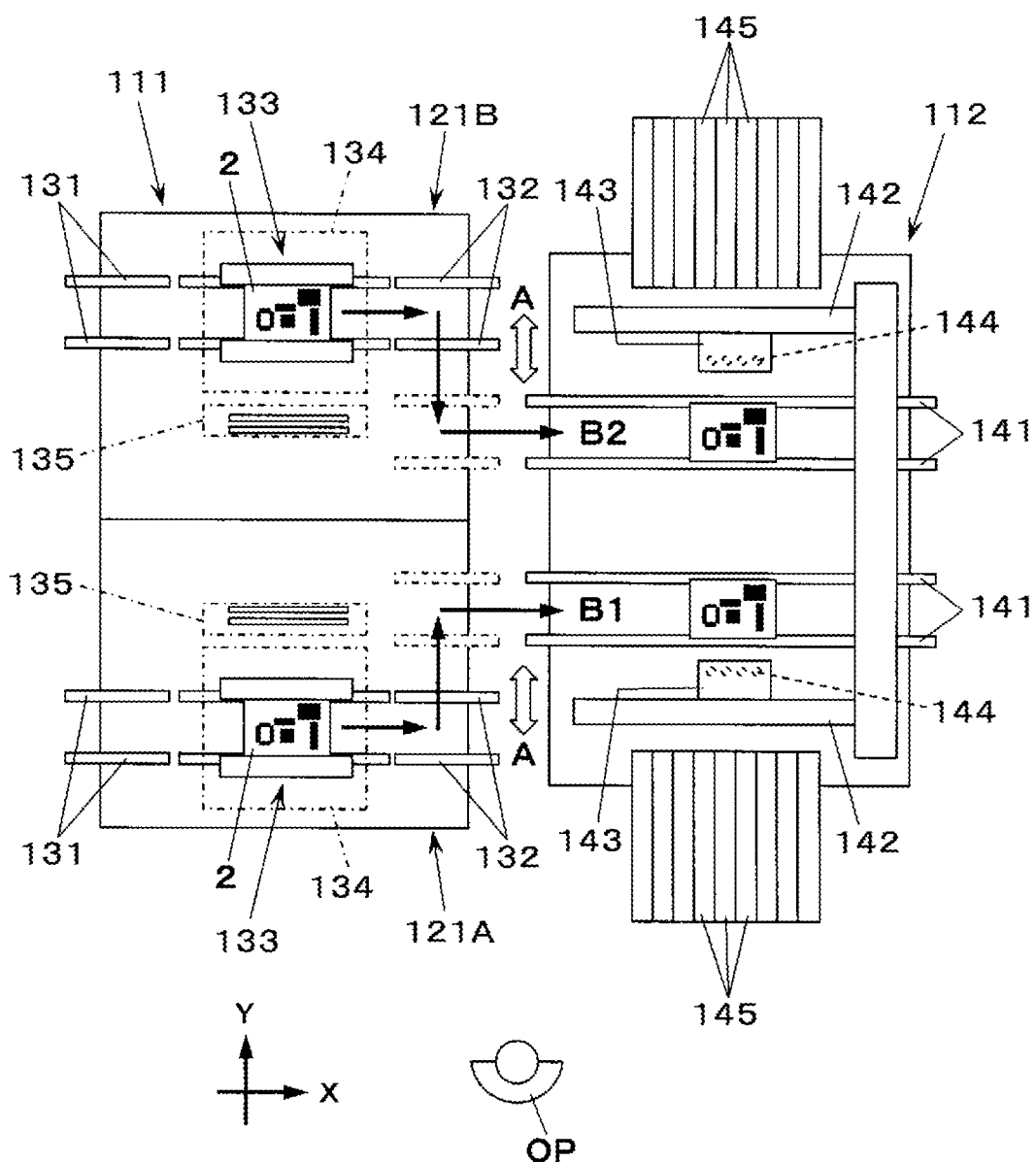
FIG. 10 is a plane view of the component mounting line including the screen printing system of the second exemplary embodiment.
Figure 11:
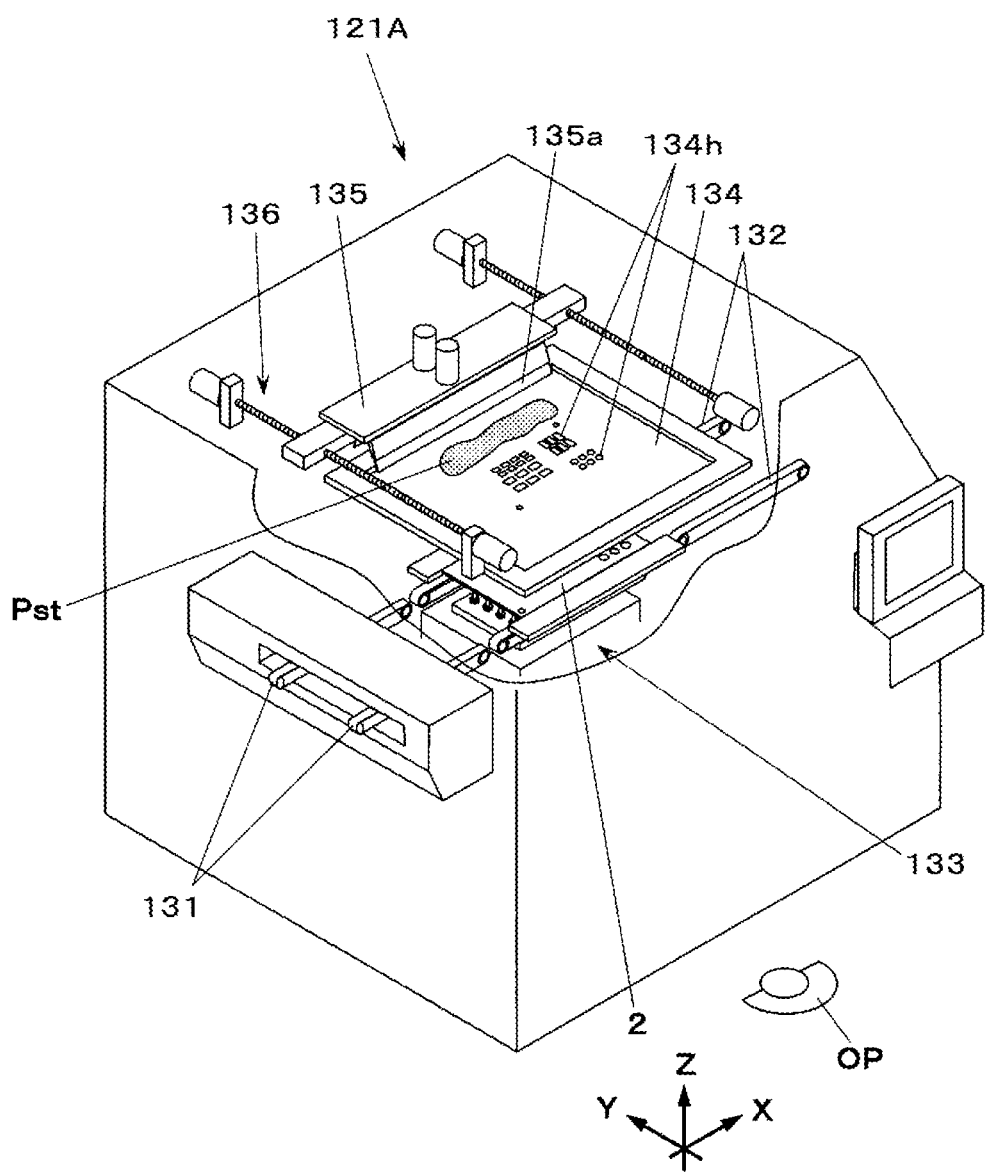
FIG. 11 is a perspective view of a primary printing apparatus configuring the screen printing system of the second exemplary embodiment.
Figure 12:
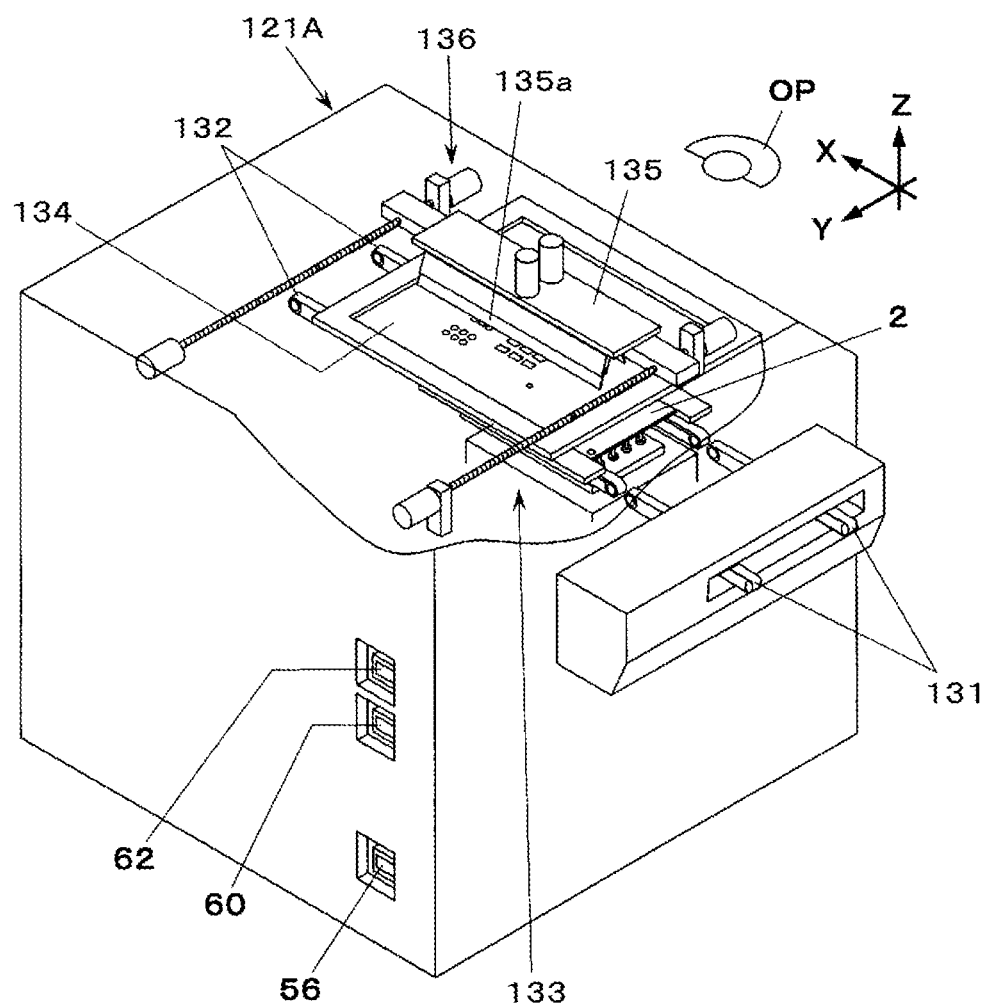
FIG. 12 is a perspective view of the primary printing apparatus configuring the screen printing system of the second exemplary embodiment.
Figure 13:
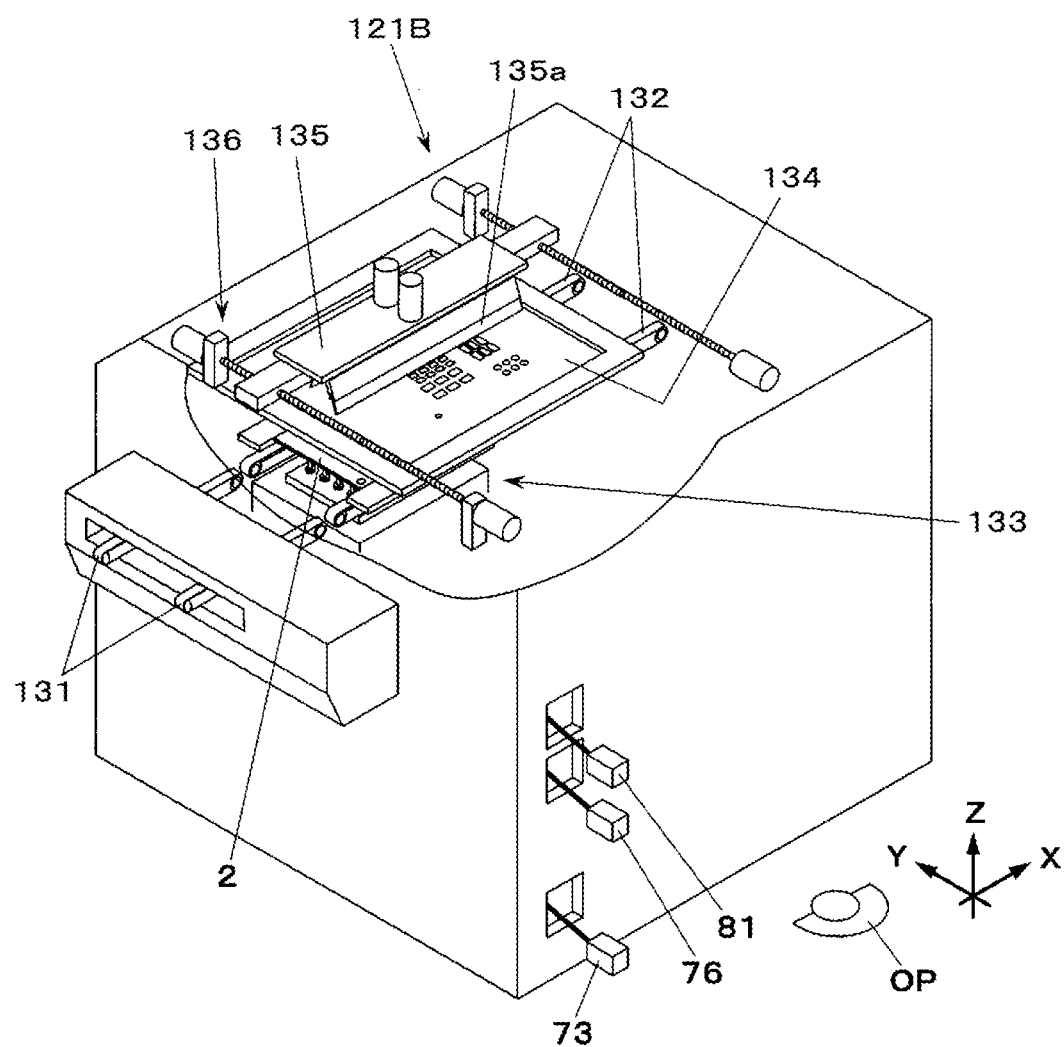
FIG. 13 is a perspective view of a secondary printing apparatus configuring the screen printing system of the second exemplary embodiment.

FIGS. 9 and 10 shows a component mounting line 101 of a second exemplary embodiment. The component mounting line 101 is a manufacturing line for manufacturing component mounted substrates 2J on which components 3 are mounted on a substrates 2 in two lanes. The component mounting line 101 is configured by a screen printing system 111 and a component mounting apparatus 112 arranged in a lower stream of the screen printing system 111. According to the present exemplary embodiment, a right-left direction seen from an operator OP is a direction that the substrates 2 are fed, and this direction is set as an X direction. The substrates 2 are flew from left side to right side seen by the operator OP. A front-rear direction seen by the operator OP is set as a Y direction. A up-down direction seen by the operator OP is set as a Z direction.

As shown in FIGS. 9 and 10, the screen printing system 111 is configured by a primary screen printing apparatus (primary printing apparatus 121A) and a secondary screen printing apparatus (secondary printing apparatus 121B). The primary printing apparatus 121A is arranged at a near side of the operator OP. The primary printing apparatus 121A and the secondary printing apparatus 121B are arranged symmetry with respect to a line which is parallel to the X direction.

As shown in FIGS. 10 to 13, each of the primary printing apparatus 121A and the secondary printing apparatus 121B includes a feed-in conveyer 131, a feed-out conveyer 132, and a substrate holding and moving portion 133 for holding the substrate 2 fed from the feed-in conveyer 131 and moving the substrate 2 in a horizontal plane and in the up-down direction. In an upper side of the substrate holding and moving portion 133, a mask plate 134 in which pattern holes 134h are formed. In an upper side of the mask plate 134, a squeegee unit 135 is provided so as to be movable in the Y direction by a squeegee unit driving mechanism 136. In the squeegee unit 135, a squeegee 135a having a paddle shape is provided so as to be movable in the up-down direction.

The substrate holding and moving portion 133 holds the substrate 2 transferred from the feed-in conveyer 131 and moves the substrate 2 so that the substrate 2 contacts with the mask plate 134 in a condition where terminals 2d (see FIG. 9) on the substrate 2 align the pattern holes 134h of the mask plate 134. When the substrate 2 contacts with the mask plate 134, the squeegee unit driving mechanism 136 moves the squeegee unit 135 in the Y direction so that the squeegee 135a slidably moves on the mask plate 134. Thereby, a paste Pst (see FIG. 11) supplied on the mask plate 134 in advance is scraped, and the paste Pst is printed on terminals 2d of the substrate 2 through the pattern holes 134h. The substrate 2 on which the paste Pst is printed is fed to the feed-out conveyer 132 from the substrate holding and moving mechanism 133. The feed-out conveyer 132 passes the fed substrate 2 to the component mounting apparatus 112 in a lower stream. The feed-out conveyer 132 is movable in the Y direction (arrow A in FIG. 10) and passes the substrate to a leading portion of a below described substrate conveying path 141 of the components mounting apparatus 112.

As shown in FIG. 10, the component mounting apparatus 112 includes two substrate conveying paths 141 for conveying the substrates 2 in the X direction and positions the substrates 2 on which the paste has been printed and fed from the screen printing system 111. In the two substrate conveying paths 141, the substrate conveying path 141 at a side of the operator OP (i.e. front side) receives the substrates 2 conveyed from the primary printing apparatus 121A (arrow B1 in FIG. 10), and the substrate conveying path 141 at an opposite side of the operator OP (i.e. rear side) receives the substrates conveyed from the secondary printing apparatus 121B (arrow B2 in FIG. 10).

As shown in FIGS. 9 and 10, the component mounting apparatus 112 includes two mounting heads 143 moved by head moving mechanisms 142. In each of the mounting heads 143, a plurality of suction nozzles 144 extending downwards are provided. In a front side and a rear side of the component mounting apparatus 112, a plurality of parts feeders 145 such as tape feeders for supplying components are respectively provided. The mounting heads 143 pick up components 3 supplied by the parts feeders 145 by suctioning by the suction nozzles 144 and mount the components 3 on the substrates 2 positioned by the substrate conveying paths 141. The substrate conveying paths 141 feed the substrates 2 to which mounting operations of the components have been completed to an outside of the component mounting apparatus 112.

A electric power supply system of the screen printing apparatus (the primary printing apparatus 121A and the secondary printing apparatus 121B) and the screen printing system 111 of the second exemplary embodiment is similar to the electric power supplying system the component mounting apparatus (the primary mounting apparatus 12A and the secondary mounting apparatus 12B) and the component mounting system 13 of the first exemplary embodiment. That is, since FIGS. 7A, 7B, 8A and 8B show the component mounting related apparatus and the component mounting related system which are common to the first exemplary embodiment and the second exemplary embodiment, descriptions for portions overlapping between the first exemplary embodiment and the second exemplary embodiment are omitted.

As described in the above, in the screen printing system 111 (the component mounting line 101) of the present exemplary embodiment, the power source 53 for supplying the electric power is provided only in the primary printing apparatus 121A (first screen printing apparatus). A power for actuation to the secondary printing apparatus 121B (second screen printing apparatus) arranged in a back side of the primary printing apparatus 121A is supplied through the power transmission connector (the primary AC power connector 56 and the primary DC power connector 60) connected to the first power transmission line. Therefore, it is unnecessary that the secondary printing apparatus 121B includes a power source provided that the secondary printing apparatus 121B includes the secondary side AC power transmission line 74 and the secondary side DC power transmission line 77 (second power transmission line) for transmitting the electric power supplied from the primary printing apparatus 121A through the power transmission connector.

Although, according to the second exemplary embodiment, the primary printing apparatus 121A and the secondary printing apparatus 121B respectively include the feed-in conveyers 131 and the feed-out conveyers 132, it is unnecessary that the screen printing apparatus of the invention includes the feed-in conveyer 131 and the feed-out conveyer 132. The feed-in conveyer 131 and the feed-out conveyer 132 may be independent and provided in an outside of the screen printing apparatus.

In accordance with one or more embodiments of the present invention, a component mounting related apparatus and component mounting related system having two lanes can be provide in a low cost.

What is claimed is:

1. A component mounting system configured to mount a component on a substrate and including a first component mounting apparatus and a second component mounting apparatus disposed back-to-back with the first component mounting apparatus, both the first component mounting apparatus and the second component mounting apparatus comprising:
   a substrate conveying line for moving substrates in a first direction;
   a parts feeder for delivering components to substrates on the substrate conveying line;
   a component camera for detecting the components; and
   a component attaching mechanism for placing the components on a respective substrate, the system comprising:

an electric power source provided in the first component mounting apparatus and configured to receive an electrical power and convert the electrical power to an AC power and a DC power supplied for actuating the first component mounting apparatus;

a first AC power transmission line and a first DC power transmission line provided in the first component mounting apparatus and configured to transmit the AC power and DC power supplied from the electric power source in the first component mounting apparatus;

a first AC power transmission connector disposed in a first opening on a back side of the first component mounting apparatus, the first AC power transmission connector configured to transmit the AC power transmitted by the first AC power transmission line;

a first DC power transmission connector disposed in a second opening on the back side of the first component mounting apparatus, the first DC power transmission connector configured to transmit the DC power transmitted by the first DC power transmission line a second AC power transmission line and a second DC power transmission provided in the second component mounting apparatus and configured to transmit the AC power and DC power supplied from the first component mounting apparatus a second AC power transmission connector disposed in a first opening on a back side of the second component mounting apparatus and connected to the second AC power transmission line; and a second DC power transmission connector disposed in a second opening on the back side of the second component mounting apparatus and connected to the second DC power transmission line wherein the first and second openings of the first component mounting apparatus are in registry with the first and second openings of the second component mounting apparatus and the first AC and DC power transmission connectors are connected to the second AC and DC power transmission connectors, respectively for transmitting the AC power and DC power from the first AC and DC from the first power transmission connectors through the second AC and DC power transmission connectors to the second AC and DC power transmission lines.

2. The component mounting apparatus according to claim 1,
wherein the electric power source is a single electric power source provided only in the first component mounting apparatus and configured to supply electrical power for actuating both the first component mounting apparatus and the second component mounting apparatus.

3. A screen printing system configured to print a paste on a substrate and including a first printing apparatus and a second screen printing apparatus disposed back-to-back with the first screen printing apparatus, both the first screen printing apparatus and the second screen printing apparatus comprising:

a substrate conveying line for moving substrates in a first direction; and
a substrate holding and moving portion for holding and moving substrates,
the system comprising:
an electric power source provided in the first screen printing apparatus and configured to receive an electrical power and convert the electrical power to an AC power and a DC power supplied for actuating the first screen printing apparatus;

first AC power transmission line and a first DC power transmission line provided in the first screen printing apparatus and configured to transmit the AC power and DC power supplied from the electric power source in the first screen printing apparatus;

a first AC power transmission connector disposed in a first opening on a back side of the first screen printing apparatus, the first AC power transmission connector configured to transmit the predetermined voltage transmitted by the first AC power transmission line;

a first DC power transmission connector disposed in a second opening on the back side of the first screen printing apparatus, the first DC power transmission connector configured to transmit the DC power transmitted by the first DC power transmission line a second AC power transmission line and a second DC power transmission line provided in the second screen printing apparatus and configured to transmit the AC power and DC power supplied from the first screen printing apparatus a second AC power transmission connector disposed in a first opening on a back side of the second screen printing apparatus and connected to the second AC power transmission line; and a second DC power transmission connector disposed in a second opening on the back side of the second screen printing apparatus and connected to the second DC power transmission line wherein the first and second openings of the first screen printing apparatus are in registry with the first and second openings of the second screen printing apparatus and the first AC and DC power transmission connector are connected to the second AC and DC power transmission connector for transmitting the AC power and DC power from the first AC and DC power transmission connectors, respectively connectors through the second AC and DC power transmission connectors to the second AC and DC power transmission lines.

4. The screen printing apparatus according to claim 3,
wherein the electric power source is a single electric power source provided only in the first screen printing apparatus and configured to supply electrical power for actuating both the first screen printing apparatus and the second screen printing apparatus.

* * * * *